United States Patent [19]

Rao et al.

[11] 4,424,527

[45] Jan. 3, 1984

[54] BONDING PAD METALLIZATION FOR SEMICONDUCTOR DEVICES

[75] Inventors: Srinivas T. Rao, South Brunswick; Jeoffrey Mott, Franklin Lakes, both of N.J.

[73] Assignee: Optical Information Systems, Inc., Elmsford, N.Y.

[21] Appl. No.: 288,857

[22] Filed: Jul. 31, 1981

[51] Int. Cl.³ ..................... H01L 29/46; H01L 23/48
[52] U.S. Cl. ....................................... 357/71; 357/65; 357/81; 372/36
[58] Field of Search ...................... 357/65, 71, 67, 17, 357/81; 372/36, 44; 29/580

[56] References Cited

U.S. PATENT DOCUMENTS

| | | | |
|---|---|---|---|
| 3,946,334 | 3/1976 | Yonezu et al. | 331/94.5 H |
| 3,959,522 | 5/1976 | Ladany et al. | 357/71 |
| 4,023,198 | 5/1977 | Malone et al. | 357/68 |
| 4,161,701 | 7/1979 | Taketa et al. | 331/94.5 H |
| 4,179,534 | 12/1979 | Chang et al. | 357/67 |
| 4,319,264 | 3/1982 | Gangulee et al. | 357/65 |
| 4,321,617 | 3/1982 | Duda et al. | 357/67 |

*Primary Examiner*—James W. Davie
*Attorney, Agent, or Firm*—Arthur L. Plevy

[57] ABSTRACT

The invention is directed to a bonding pad metallization for stress sensitive semiconductor devices such as semiconductor lasers or the like. An attendant advantage is a diffusion barrier layer which inhibits the migration of conventional bonding materials such as indium solder.

15 Claims, 3 Drawing Figures

BONDING PAD METALLIZATION FOR SEMICONDUCTOR DEVICES

BACKGROUND

The invention relates to bonding pads for semiconductor devices and more particularly to an improved metallization for stress sensitive semiconductor devices having a gold bonding pad mounted to a heat sink by way of indium solder.

Numerous semiconductor devices utilized one or more of their electrical contacts as mounting pads for securing the devices to heat dissipation means, i.e. heatsinks. A prime example of such a device is a semiconductor laser which presently requires sophisticated heat sinking to permit long term operability. In gallium arsenide/aluminum gallium arsenide double heterostructure lasers, for example, both the P and N sides are metallized to provide both a ohmic contact and a surface for bonding to the heat sink. Gold is commonly employed either as an ohmic contact or to overcoat the ohmic contact, principally because of its excellent thermal and electrical characteristics and high corrosion resistance. It is also readily bondable with indium and other solder materials. There is substantial indication, however, that gold alloys with certain solder materials; indium, for example forms the intermetallic $AuIn_2$ which grows with time and may alter the effectiveness of the heat dissipation means. The formation of such intermetallic increases the probably of device failure.

In addition to the problems caused by the formation of intermetallics, device metallization also typically results in the exertion of stress upon the semiconductor by the metallic layers. Semiconductor devices such as the gallium arsenide laser, are often susceptible to stresses developed by the metallic layers. The present invention is of advantage in providing both a metallization barrier layer to inhibit the migration of the bonding metals and concurrently produces substantially stress free metallization of the bonding pad structure. The invention is particularly suited for application to gallium arsenide semiconductor lasers which exhibit particular sensitivity to metallization.

The advantage of providing thermal stress relief in mounting pads for semiconductor lasers had been recognized in the art. In U.S. Pat. No. 4,161,701 for example, Taketa et al., reduces the stress exerted on the active region from a semiconductor layer by the selective geometric etching of the supporting and conducting substrate. A second technique, as taught in U.S. Pat. No. 3,946,334, deposits a relatively thick gold layer onto the laser prior to its mounting onto a standard heat sink. The art has not, heretofore, recognized the concurrent stress and migration advantage of the herein taught invention.

SUMMARY OF THE INVENTION

The present invention is directed to a bonding pad metallization for semiconductor devices which provides substantially reduced stress from being exerted on the semiconductor device and concurrently provides a diffusion barrier layer which inhibits the alloying of the pad material with conventionally used securing materials such as indium solder. In one embodiment a bonding pad includes a relatively thick first layer of gold followed by a second, relatively thin diffusion barrier layer of nickel disposed on the gold layer. The thicknesses of the gold and nickel layer are adjusted to compensate for the tension and compression forces developed in each respective layer. The construction results in a nulling of the stress forces exerted on the semi-conductor device upon which the layers are disposed.

BRIEF DESCRIPTION OF THE DRAWINGS

In the drawings,

FIGS. 2 and 3 illustrate only the metallization layers, showing only in phantom the semiconductor device illustrated in FIG. 1.

DETAILED DESCRIPTION OF THE INVENTION

Figure 1:
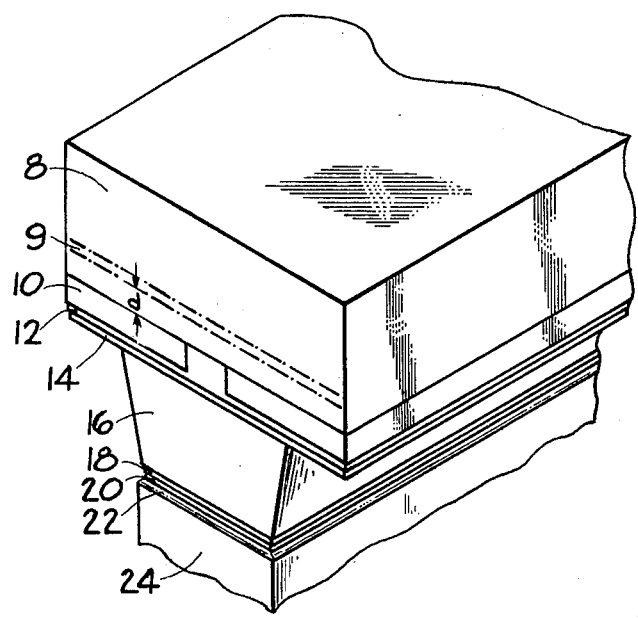
FIG. 1 shows an enlarged side view, in perspective of the bonding pad of the present invention.

Referring to figure, a semiconductor device 8 may include one or more semiconductor junctions here shown at 9. In one embodiment, semiconductor 8 may comprise a GaAs/GaAlAs double heterostructure laser, hereinafter gallium arsenide laser, having an active or junction region 9 which is at a relatively short distance d from the surface to be metallized. The advantages of the invention are best exemplified in the bonding of the P side metallization of the gallium arsinide laser, which will be used herein to illustrate the novel characteristics of the bonding pad metallization of the present invention. A conventional P side metallization of the gallium arsinide layer includes an insulating layer 10 such as $SiO_2$ used to define the area of contact to the underlying semiconductor surface of the subsequently deposited metallic layers. A window region 12' defines the area of electrical contact to the underlying semiconductor surface. An ohmic contact material 12 is disposed both on insulating layer 10 and the window region indicated at 12'. The material comprising layer 12 is selected from metal known to make an ohmic contact to the underlying semiconductor material. For gallium arsenide a P-contact may comprise a layer of chromium, vacuum deposited onto the surface of P-type gallium arsenide. A relatively thin layer of gold 14 may be deposited onto chromium layer 12 to avoid corrosion of chromium layer 12. These contact layers comprise conventional ohmic contacts to P-type gallium arsenide and constitute no part of the present invention.

A bonding pad 16 comprises a relatively thick layer of gold which may be deposited using conventional sheet metallurgy techniques. The minimum thickness of layer 16 is principally dependent upon the surface metallurgy of the underlying layer taking into consideration the objective of the bonding layer to insure a relative smooth and uniform layer to insure optimal thermal and electrical characteristics. In practice, bonding layers as thin as 1.5 to 2.0 microns have been successfully employed in the invention. The maximum thickness is dependent upon both practical concerns, i.e., time to manufacture, raw materials costs, and upon the stress characteristics exerted by the layer on contiguous layers. Relatively thick layers ranging from about 6.0 to 8.0 microns have been successfully utilized in the present invention.

In one embodiment, the bonding pad 16 may be electrodeposited from a suitable electrolyte containing gold salts. Commercially available plating solutions such as Engelhard's gold plating solution designated "E-59" has been employed in conventional sheet metallurgy to electroplate suitable gold bonding layers. As presently understood and in accordance with one aspect of the invention, the gold bonding pad layer 16 exhibits a tension stress force.

A relatively thin diffusion barrier layer 18 comprises a layer of nickel ranging in thickness from about 0.15 microns to about 0.5 microns. Similar to the bonding pad, barrier layer 18 may be electro-deposited from a suitable electrolyte containing nickel salts. In a preferred embodiment, diffusion barrier 18 comprises a 0.5 micron pulse plated layer of nickel which serves to inhibit the diffusion of contiguous layers as discussed hereinafter. Within the stated thickness range, the stress in the nickel layer deposit is in compression. The thickness of the nickel layer is particularly adapted relative to the thickness of the gold layer to cancel or null the stress forces originating in the gold and nickel layers. That is to say, the compressive stess of the nickel layer nulls the tension stress of the continguous gold bonding pad layer. In this manner the overall stress exerted by the bonding pad metallization onto the contiguous semiconductor is minimized. In addition to the complimentary stress characteristics of the nickel layer, the layer serves as an effective diffusion barrier to inhibit the diffusion of contiguous materials and significantly inhibits the migration of indium contact layers known in the art to alloy with gold and alter both the electroconductive and thermal conductive characteristics of the gold.

A contact layer 20 may, in one embodiment, comprise a relatively thin layer of gold serves to facilitate the adherence of common bonding materials such as indium solder and concurrently serves as a corrosion barrier for the underlying nickel layer 18.

Conventional heat sink means here shown at 24 may be secured to the bonding pad by electroconductive adherence layer 22, numerous known alternatives for which are known in the art. In a particular embodiment, heat sink 24 comprises a gold coated copper block and adherence layer 22 comprises low melting point indium solder. In such an embodiment, for example, diffusion barrier 18 functions to inhibit the formation of an intermetallic gold indium alloy which is understood to deteriorate the thermal conducting characteristics between the bonding pad 16 and the heat sink 24. A deterioration of the heat transfer capability of the bonding pad to the heat sink would result in a reduced expected lifetime for the gallium arsenide laser. Thereby, according to one aspect of the present invention, diffusion layer 18 serves to enhance the permanence of the thermal conductance characteristics of the bonding pad to the heat sink, increasing the expected lifetime of the semiconductor device. The thickness of bonding layer 16 concurrently serves to elevate the semiconductor device 8 from the heat sink surface 24.

Figure 2:
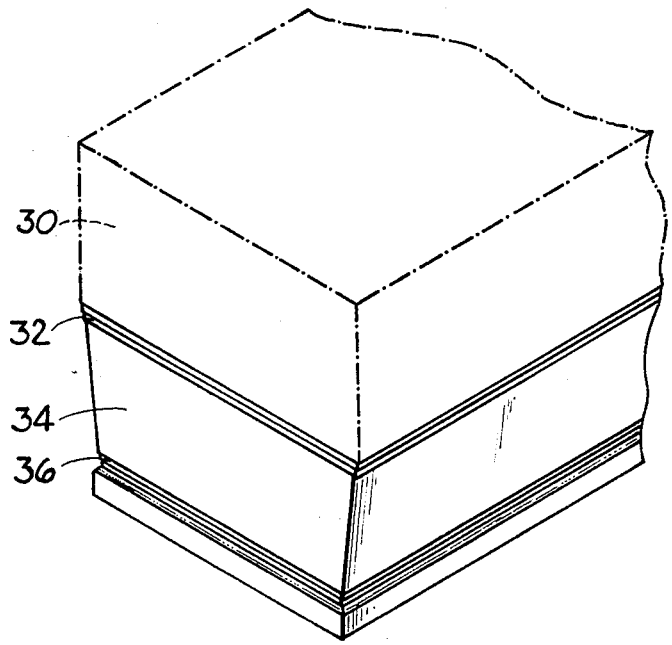
FIG. 2 shows an enlarged side view of a closely cleaved bonding pad employing the present invention.

Referring to FIG. 2, there is shown a second illustrative embodiment of the invention which will generally be referred to herein as a closely cleared mounting arrangement. Under certain device mounting conditions, the embodiment illustrated in FIG. 1 may evidence indium ingress at the exterior surfaces of the gold/gold junction of layers 14 and 16. In this embodiment, the effect is deterred by employing the close clearing construction design illustrated in FIG. 2. Referring to the drawing, a semiconductor device 30 comprises substantially the same laser device described heretofore with references to FIG. 1 including contact and insulating layers. The sheet metallurgy, layer thicknesses and stress characteristics for contact coating layer 30, bonding pad layer 34 and nickel diffusion layer 36 are also substantially identical to that described for layers 14, 16 and 18 of FIG. 1 with the exception that the layers extend across virtually the entire surface of the semiconductor. This metallization arrangement virtually eliminates the afore-described free gold surface and minimizes indium ingress.

Figure 3:
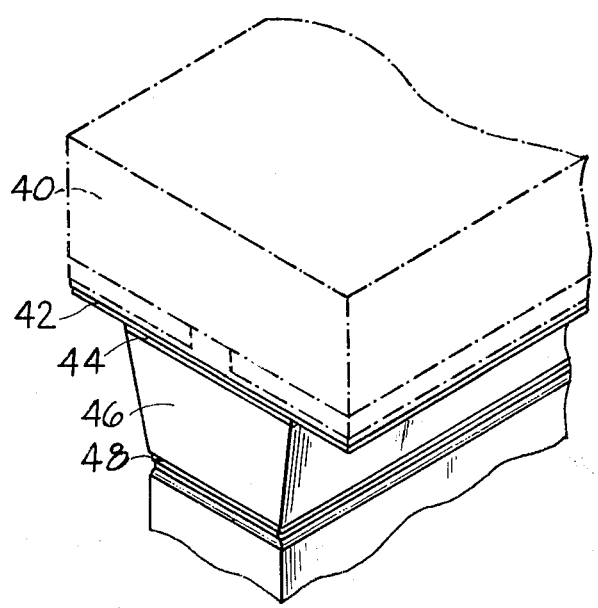
FIG. 3 is also an enlarged side view, in perspective, illustrating an alternate embodiment of the invention employing an added diffusion barrier layer.

Referring to FIG. 3, there is shown an alternate embodiment of the invention also adapted to minimize indium ingress. Referring to the drawing, a semiconductor device 40 comprises substantially the same laser device described heretofore with reference to FIGS. 1 and 2. A first, relatively thin gold layer 42 has a thin layer of nickel 44 deposed thereon. The relatively thick gold bonding pad 46 is deposited onto nickel layer 44, thus eliminating the gold/gold interface described in earlier embodiments. A nickel diffusion layer 48 is deposited onto the gold bonding pad utilizing conventional sheet metallurgy. As described in reference to FIG. 1, the thickness of nickel layers 44 and 48 are controlled in relation to the thickness of the gold bonding pad 46 to provide the stress minimization characteristic of the invention.

To further assist one skilled in the art, here following is a specific example of one embodiment of the present invention.

EXAMPLE 1

An Aluminum-Gallium Arsenide double heterostructure, laser diode obtained from Optical Information Systems, Elmsford, N.Y., was mounted into a particularly adapted electroplating apparatus exposing the laser's P-side for plating. A P-contact was formed by first plating a layer of nickel using a plating solution commercially available under the tradename NICKELEX from the Transene Co. The nickel layer was plated for about two minutes at room temperature (about 22° C.) at a plating current density of about 2.5 mA/cm$^2$. This resulted in a nickel layer about 400 Å angstroms in thickness.

A thin layer of gold was plated from a solution of E-59, commercially available through Englehardt Co., having a solution concentration of about 1.5 troy oz/liter solution and ph adjusted to about 7.0. The gold layer was deposited at a plating current density of about 4.0 mA/cm$^2$ for about 15 seconds, maintaining the plating solution at about 65° C. The thickness of the gold layer so deposited was estimated to be about 600 Å angstroms.

A gold bonding pad was deposited onto the P-contact by pulse plating from the above described E-59 solution. The sheet metallurgy employed pulse plating at a current density of 15 mA/cm$^2$, 20% duty cycle at 1.0 kilohertz. A gold pad, about 2 microns thick was plated in about 10 minutes.

A nickel barrier layer was deposited onto the gold pad by electron beam to a thickness of about 1500 angstroms. The temperature of the bonding pad was elevated to about 135° C. during the deposition. A gold contact layer was deposited also at 135° C. by electron beam to a thickness of about 1000 Angstroms to complete the metallization of the device.

EXAMPLE 2

The device metallization of this example is substantially similar to that illustrated in reference to FIG. 2, eliminating the ledge configuration between gold/gold layers. A broad P-contact was constructed by first depositing about 300 Angstroms of chromium followed by 1000 Angstroms of gold, both deposited by electron beam at a temperature of about 135° C.

A gold bonding pad, about 2.0 microns in thickness, was pulse plated from the above described E-59 plating solution having a 20% duty cycle and a frequency of 1.0 kilohertz.

The broad P-contact and the bonding pad extended the width of the device as illustrated in FIG. 2.

A 1500 Angstrom nickel barrier layer and a 1000 Angstrom gold contact layer were deposited onto the bonding pad by electron beam, deposited at 135° C. to complete the construction of the device.

What is claimed is:

1. A bonding pad metallization for semiconductor electronic devices comprising:
   a first layer of gold having a thickness of 1.5 microns or greater deposited onto said semiconductor device;
   a layer of nickel deposited onto said gold layer;
   a second layer of gold deposited onto said nickel layer, with said layer of nickel and said second layer of gold both being relatively thin as compared to said first layer of gold.

2. The bonding pad metallization of claim 1 wherein said semiconductor device comprises a semiconductor laser.

3. The bonding pad metallization of claim 2 wherein said laser comprises a GaAs/GaAlAs semiconductor laser.

4. The bonding pad metallization of claim 3 wherein said first layer of gold ranges in thickness from about 1.5 microns to about 8.0 microns.

5. The bonding pad metallization of claim 4 wherein said nickel layer ranges in thickness from about 0.15 microns to about 0.5 microns.

6. The bonding pad metallization according to claim 5, wherein said second layer of gold ranges in thickness from about 0.2 microns to about 0.5 microns.

7. A bonding pad metallization for contacting the p-region of an GaAs/AlGaAs semiconductor laser comprising:
   a first layer of gold ranging in thickness from about 1.5 microns to about 8.0 microns deposited onto a chrome/gold contact to said p-region of the GaAs/AlGaAs laser, said first layer of gold being characterized as being in tension;
   a layer of amorphous nickel ranging in thickness from about 0.15 microns to about 0.5 microns deposited onto said first gold layer, said nickel layer being characterized as being in compression;
   a second layer of gold ranging in thickness from about 0.2 microns to about 0.5 microns deposited onto said nickel layer.

8. The bonding pad metallization of claim 7 wherein said first layer of gold comprises pulse plated gold.

9. The bonding pad metallization of claim 8 wherein said nickel comprises electroplated nickel.

10. A metallization pad for indium solder bonding a semiconductor device having a gold contact layer comprising:
    a pad layer of gold deposited onto the said gold contact layer, said pad layer being characterized as being in tension and having a thickness in the range from about 1.5 microns to about 8.0 microns;
    a nickel layer deposited onto said pad layer said nickel layer being characterized as being in compression with said nickel layer being relatively thin as compared to said gold pad layer;
    a bonding layer of gold deposited onto said nickel layer with said bonding layer being also relatively thinner than said pad layer;
    an indium bonding layer contacting said gold bonding layer whereby indium diffusion and alloying with layers is minimized by the nickel layer.

11. The metallization pad of claim 10 wherein said gold bonding layer ranges in thickness from about 0.2 microns to about 0.5 microns.

12. The metallization pad of claim 11 wherein said nickel layer ranges in thickness from about 0.15 microns to about 0.5 microns.

13. The metallization pad of claim 12 wherein said semiconductor device comprises a GaAs/GaAlAs laser.

14. The metallization pad for claim 13 wherein said gold contact is contiguous to a contact to a p-region of the GaAs/AlGaAs laser.

15. The metallization pad of claim 10 wherein said pad layer, said nickel layer and said bonding layer extend over substantially equal areas of the semiconductor device whereby inter-layer free surfaces are minimized to minimize indium ingress.

* * * * *